(12) United States Patent
Yoshida et al.

(10) Patent No.: US 6,326,789 B1
(45) Date of Patent: Dec. 4, 2001

(54) RECEIVE COIL AND MAGNETIC RESONANCE IMAGING METHOD AND APPARATUS

(75) Inventors: Masaru Yoshida; Kenji Sato; Kensaku Morita, all of Tokyo (JP)

(73) Assignee: Ge Yokogawa Medical Systems, Limited, Tokyo (JP)

( * ) Notice: Subject to any disclaimer, the term of this patent is extended or adjusted under 35 U.S.C. 154(b) by 0 days.

(21) Appl. No.: 09/476,263

(22) Filed: Jan. 3, 2000

(51) Int. Cl.[7] .................................................. G01V 3/00
(52) U.S. Cl. ........................... 324/318; 324/309; 324/307
(58) Field of Search .................................. 324/318, 309, 324/322, 307, 312

(56) References Cited

U.S. PATENT DOCUMENTS 5,208,534 * 5/1993 Okamoto et al. ..................... 324/309
5,383,903 * 1/1995 Young ................................... 324/318
5,757,189 * 5/1998 Molyneaux et al. .................. 324/318

OTHER PUBLICATIONS

Encyclopeaudia of NMR ed. Grant et al (1996) pp 1841–1846.*

* cited by examiner

*Primary Examiner*—Hezron Williams
*Assistant Examiner*—Brij B. Shrivastav
(74) *Attorney, Agent, or Firm*—Moonray Kojima

(57) ABSTRACT

In order to provide a receive coil comprising a plurality of coils that make no coupling, and a magnetic resonance imaging method and apparatus employing such a receive coil, when a receive coil is formed by disposing a plurality of loops of conductor 424 having series capacitors 422, a low input-impedance amplifier 426 is provided with its input circuit connected in parallel to both ends of the capacitor 422 via an inductor 428 to achieve decoupling between the loops by a high impedance caused by parallel resonance of an LC circuit.

12 Claims, 14 Drawing Sheets

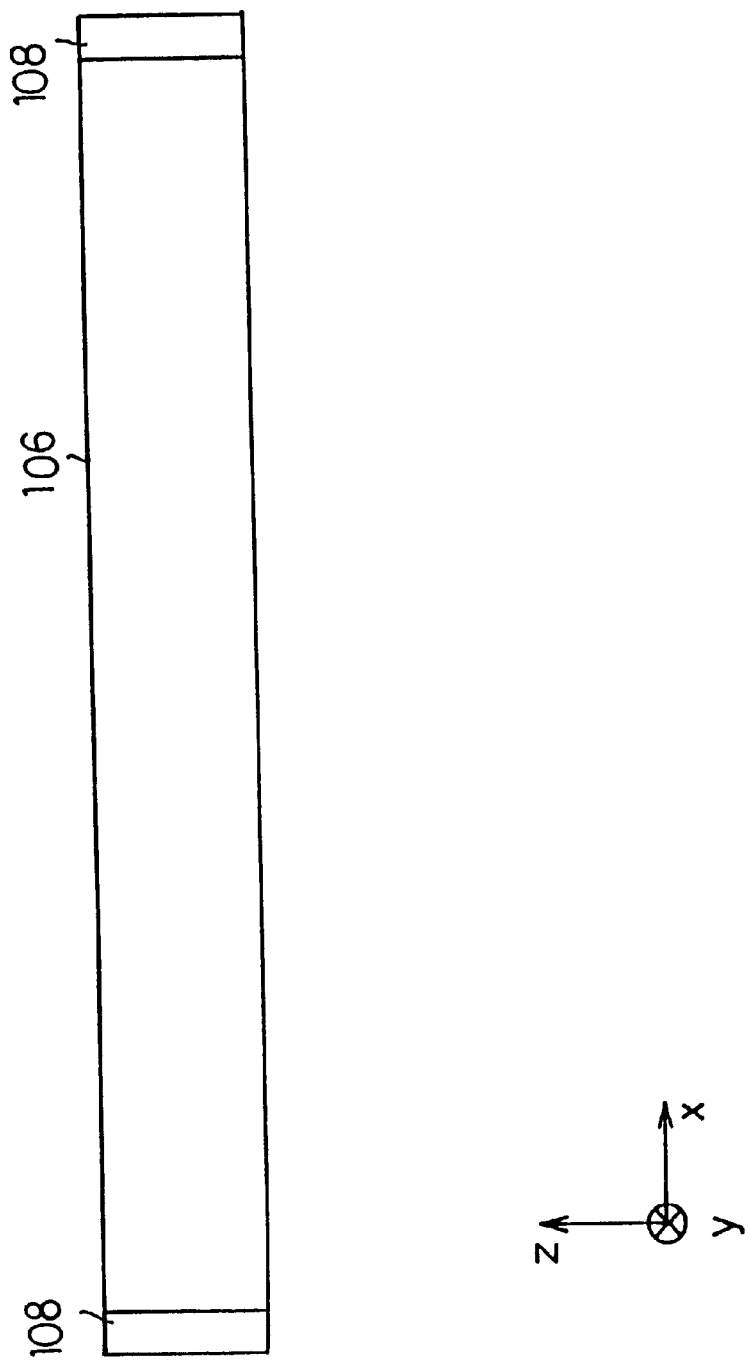

RECEIVE COIL AND MAGNETIC RESONANCE IMAGING METHOD AND APPARATUS

BACKGROUND OF THE INVENTION

The present invention relates to a receive coil and a magnetic resonance imaging method and apparatus, and more particularly to a receive coil comprising a plurality of conductive loops having series capacitors, and a magnetic resonance imaging method and apparatus employing such a receive coil.

In a magnetic resonance imaging apparatus, a receive coil is disposed closed to and around the subject so that a magnetic resonance signal is measured at a position as close to an imaging site as possible to improve the SNR (signal-to-noise ratio) of the signal.

Typical examples of such a receive coil include a solenoid-type receive coil for use in spine imaging. Since the spine is generally recognized as three parts, i.e., the C(cervical)-spine, the T(thoracic)-spine and the L(lumbar)-spine, three types of the receive coils are provided to be properly used according to which part of the spine is to be imaged.

If a plurality of the receive coils are simultaneously used, electromagnetic coupling occurs and it changes the resonance frequency of the coil. Therefore, when two or more parts of the spine in the same subject are to be imaged, respective dedicated receive coils are used and exchanged appropriately according to use so that the coupling can be avoided.

When the plurality of parts of the spine are imaged as described above, the need to exchange the receive coils makes operation cumbersome, and requires the subject to change his/her position, for example, which may cause a burden to the subject.

On the other hand, the plurality of parts of the spine can be simultaneously imaged if the axial length of the solenoid coil is extended to widen the receive sensitivity range in the body axis direction. However, the coil having such an extended length reduces the SNR of the received signal.

SUMMARY OF THE INVENTION

It is an object of the present invention to provide a receive coil comprising a plurality of coils that make no coupling, and a magnetic resonance imaging method and apparatus employing such a receive coil.

In accordance with a first aspect of the invention, there is provided a receive coil comprising a plurality of conductive loops having series capacitors, each of the loops comprising a low input-impedance amplifier with an input circuit of the low input-impedance amplifier connected in parallel to both ends of the capacitor via an inductor.

In accordance with a second aspect of the invention, there is provided a magnetic resonance imaging method comprising the steps of generating a static magnetic field in a space holding a subject, generating a gradient magnetic field in the space, generating a high frequency magnetic field in the space, measuring a magnetic resonance signal from the space, and producing an image based on the measured magnetic resonance signal, wherein the step of measuring a magnetic resonance signal is performed using a receive coil comprising a plurality of conductive loops having series capacitors, each of the loops having a low input-impedance amplifier with an input circuit of the low input-impedance amplifier connected in parallel to both ends of the capacitor via an inductor.

In accordance with a third aspect of the invention, there is provided a magnetic resonance imaging apparatus having static magnetic field generating means for generating a static magnetic field in a space holding a subject, gradient magnetic field generating means for generating a gradient magnetic field in the space, high frequency magnetic field generating means for generating a high frequency magnetic field in the space, measuring means for measuring a magnetic resonance signal from the space, and image producing means for producing an image based on the magnetic resonance signal measured by the measuring means, wherein the measuring means comprises a receive coil comprising a plurality of conductive loops having series capacitors, each of the loops having a low input-impedance amplifier with an input circuit of the low input-impedance amplifier connected in parallel to both ends of the capacitor via an inductor.

In accordance with a fourth aspect of the invention, there is provided the magnetic resonance imaging apparatus as described regarding the third aspect, wherein the measuring means comprises: a second receive coil consisting of a conductive loop having series capacitors, the second receive coil having sensitivity in the direction perpendicular to the sensitivity direction of the receive coil, the loop having a low input-impedance amplifier with an input circuit of the low input-impedance amplifier connected in parallel to both ends of the capacitor via an inductor; and a frequency selective signal block circuit for connecting a ground side of an output signal line of at least one of the low input-impedance amplifiers to a common ground.

In any one of the first through fourth aspects of the invention, it is preferred that the loop have disable means that is controlled by an external signal, in that decoupling performance is further improved.

Moreover, in the second or third aspect of the invention, it is preferred that a frequency selective signal block circuit be provided for each low input-impedance amplifier, for connecting a ground side of an output signal line of each low input-impedance amplifier to a common ground, in that a received signal is obtained with a good SNR.

Furthermore, in the third or fourth aspect of the invention, it is preferred that the frequency selective signal block circuit be a trap circuit, in that the signal blocking is effectively achieved.

Still furthermore, in the fourth aspect of the invention, it is preferred that the second receive coil be a saddle-type coil, in that quadrature reception is effectively achieved.

EFFECT

According to the present invention, the inductor is connected in parallel to the capacitor in the loop via a low input impedance of the amplifier, and hence an LC parallel circuit is established. A high impedance caused by the parallel resonance blocks coupling between the loops.

Thus, the present invention can provide a receive coil comprising a plurality of coils that make no coupling, and a magnetic resonance imaging method and apparatus employing such a receive coil.

Further objects and advantages of the present invention will be apparent from the following description of the preferred embodiments of the invention as illustrated in the accompanying drawings.

BRIEF DESCRIPTION OF THE DRAWINGS

FIG. 8 is an exploded diagram of the receive coil section in the apparatus shown in FIG. 1.

DETAILED DESCRIPTION OF THE INVENTION

Figure 1:
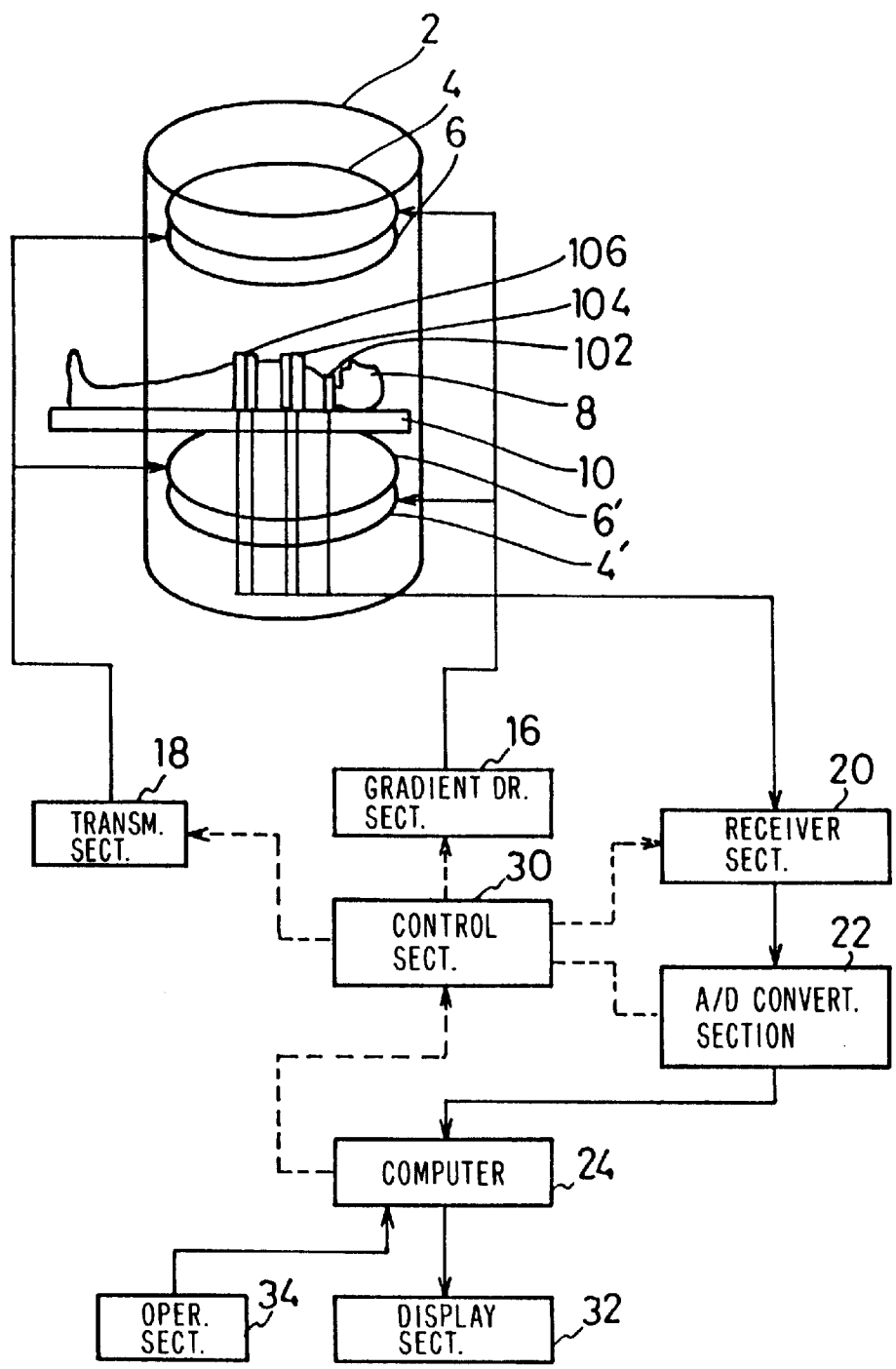
FIG. 1 is a block diagram of an apparatus in accordance with an embodiment of the present invention.

The embodiments of the present invention will now be described in more detail with reference to the accompanying drawings. FIG. 1 shows a block diagram of a magnetic resonance imaging apparatus, which is an embodiment of the present invention. The configuration of the apparatus represents an embodiment of the apparatus in accordance with the present invention, and the operation of the apparatus represents an embodiment of the method in accordance with the present invention.

As shown in FIG. 1, the apparatus comprises a static magnetic field generating section 2, which generates a homogeneous static magnetic field in its internal space. The static magnetic field generating section 2 comprises a pair of magnetism generators (not shown), such as permanent magnets, which face each other in the vertical direction maintaining a certain distance, generating the static magnetic field (vertical magnetic field) within the interposed space. It will be easily recognized that the magnetism generator is not limited to the permanent magnet but may be a superconductive electromagnet, a normal conductive electromagnet or the like.

Within the internal space of the static magnetic field generating section 2 are disposed gradient coil sections 4, 4', and transmit coil sections 6, 6' facing each other likewise in the vertical direction maintaining respective distances.

A subject 8 is placed on an imaging table 10 and carried into a space interposed between the opposing transmit coil sections 6, 6' by carrying means (not shown). The body axis of the subject 8 is orthogonal to the direction of the static magnetic field. The imaging table 10 is attached with receive coil sections 102, 104 and 106 surrounding respective sites of the subject 8 to be imaged. The receive coil sections 102, 104 and 106 represent an embodiment of the receive coil of the present invention.

The receive coil section 102 is directed to imaging of the C-spine and is attached enveloping the neck of the subject 8. The receive coil section 104 is directed to imaging of the T-spine and is attached enveloping the breast of the subject 8. The receive coil section 104 is comprised of, for example, two coils forming a pair. It should be noted that the number of the coils forming a pair (or a group) is not limited to two but may be any appropriate number. The receive coil section 106 is directed to imaging of the L-spine and is attached enveloping the hip of the subject 8. The receive coil section 106 is also comprised of, for example, two coils forming a pair. Again, the number of the coils forming a pair (or a group) is not limited to two but may be any appropriate number. More detailed description of the configuration of the receive coil sections 102, 104 and 106 will be made later.

The gradient coil sections 4, 4' are connected with a gradient driving section 16. The gradient driving section 16 supplies a drive signal to the gradient coil sections 4, 4' to generate gradient magnetic fields. The gradient coil sections 4, 4' and the gradient driving section 16 together represent an embodiment of the gradient magnetic field generating means of the present invention. The gradient magnetic fields to be generated are following three: a slice gradient magnetic field, a readout gradient magnetic field and a phase-encoding gradient magnetic field.

The transmit coil sections 6, 6' are connected with a transmitter section 18. The transmitter section 18 supplies a drive signal to the transmit coil sections 6, 6' to generate an RF magnetic field, thereby exciting spins within the subject 8.

The receive coil sections 102, 104 and 106 receive magnetic resonance signals generated by the excited spins within the subject 8. The receive coil sections 102, 104 and 106 receive respective magnetic resonance signals at the C-, T- and L-spines. The receive coil sections 102, 104 and 106 are connected to the input of a receiver section 20 and input the respective received signals to the receiver section 20.

The receiver section 20 accepts the received signal from one of the receive coil sections 102, 104 and 106 via a switch (not shown). Alternatively, three receiver systems may be provided corresponding to the receive coil sections 102, 104 and 106 to receive respective signals. It should be noted that the receiver section 20 has a plurality of receive circuits (not shown) corresponding to the plurality of coils forming a pair (or a group).

The output of the receiver section 20 is connected to the input of an analog-to-digital (A-D) converter section 22. The A-D converter section 22 converts an output signal from the receiver section 20 into a digital signal. The A-D converter section 22 has A-D converting circuits corresponding to the receive circuits. The A-D converter section 22 may comprise three A-D converting systems corresponding to the three receive circuits in the receiver section 20.

The output of the A-D converter section 22 is connected to a computer 24.

The computer 24 receives the digital signal from the A-D converter section 22 and stores it into a memory (not shown). Thus, a data space is formed in the memory. When three A-D converting systems are provided, a data space is formed for each system. Each data space constitutes a two-dimensional Fourier space. The computer 24 performs a two-dimensional inverse Fourier transformation on the data in the two-dimensional Fourier spaces to reconstruct an image of the subject 8.

The computer 24 is connected to a control section 30, which is in turn connected to the gradient driving section 16, the transmitter section 18, the receiver section 20 and the A-D converter section 22. The control section 30 controls the gradient driving section 16, the transmitter section 18, the receiver section 20 and the A-D converter section 22 based on instructions supplied from the computer 24 to perform magnetic resonance imaging.

The computer 24 is connected with a display section 32 that displays the reconstructed image and several information output from the computer 24, and an operating section 34 that is operated by a human operator inputting several commands and information to the computer 24.

Figure 2B:
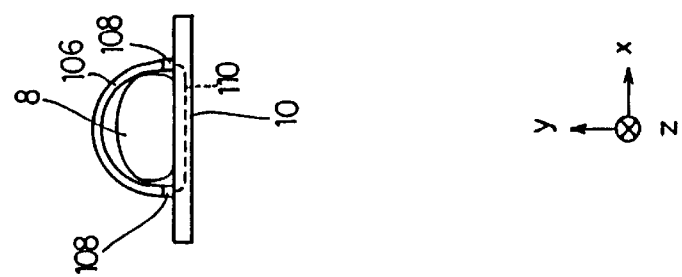
FIG. 2 schematically illustrates configuration of receive coil sections in the apparatus shown in FIG. 1.
Figure 2A:
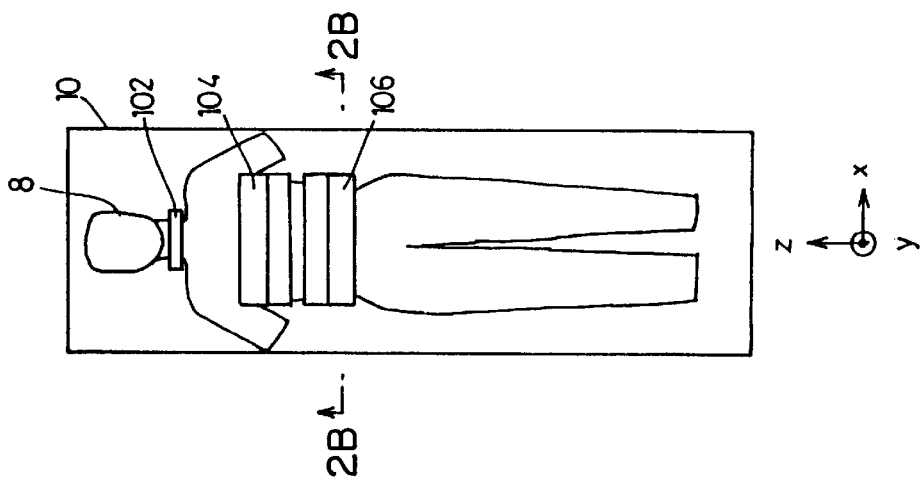

FIG. 2 schematically shows exemplary configuration of the receive coil sections 102, 104 and 106 along with the subject 8 and the imaging table 10, wherein (a) is a plan view and (b) is a cross-sectional view taken along line A—A. In either of the drawings, three mutually orthogonal directions are designated as x, y and z. The x-direction is defined as the horizontal direction of the receive coil sections 102,104 and 106, the y-direction is defined as the vertical direction of the receive coil sections 102, 104 and 106, and the z-direction is defined as the axial direction of the receive coil sections 102, 104 and 106. These definitions apply to other drawings hereinafter.

As shown in FIG. 2, two partial coils forming the receive coil section 106 generally semi-circularly surround the hip of the subject 8, and are attached to corresponding connectors on the imaging table 10 (not shown) via their connectors 108 at both ends. The imaging table 10 is provided under its surface with an electric circuit 110 for each partial coil to connect the connectors. Each electric circuit 110 forms a closed loop in combination with a partial coil. Thus, two coils each of which has one turn or any appropriate number of turns of the closed loop are formed. The receive coil sections 104 and 102 surround the breast and the neck of the subject 8, respectively, and are attached on the imaging table 10 in a similar configuration to that of the receive coil section 106. Each of the receive coil sections 104 and 102 forms a closed loop.

Figure 3:
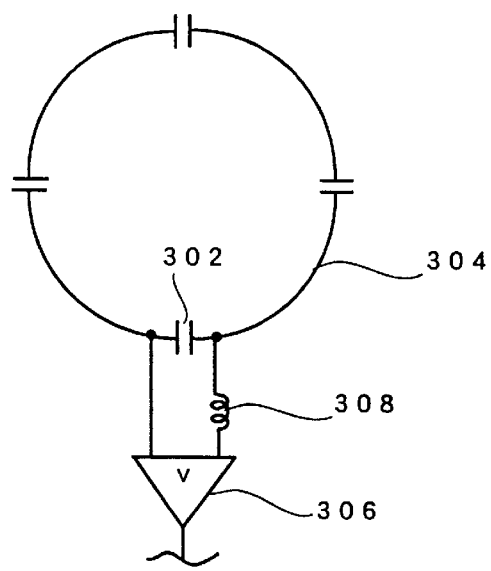
FIG. 3 is an electric circuit diagram of the receive coil section in the apparatus shown in FIG. 1.

FIG. 3 shows an exemplary electric circuit of the closed loop. The closed loop constitutes a receive coil. As shown, the closed loop is formed by connecting capacitors 302 and conductors 304 in series. Designations for the capacitors and the conductors are represented by respective reference numerals at one position in the drawing. The closed loop represents an embodiment of the loop of the present invention, and the capacitor 302 represents an embodiment of the capacitor of the present invention. The number of the capacitors 302 is not limited to four as shown but may be any appropriate number. The conductor 304 represents an embodiment of the conductor of the present invention.

To both ends of one capacitor 302 is connected an input circuit of a preamplifier 306 via an inductor 308, for amplifying a magnetic resonance signal received by the closed loop. The inductor 308 represents an embodiment of the inductor of the present invention. As the preamplifier 306, an amplifier whose input circuit has a sufficiently low impedance, i.e., a low input-impedance amplifier, is employed. The preamplifier 306 represents an embodiment of the low input-impedance amplifier of the present invention.

Because the preamplifier 306 is a low input-impedance amplifier, an LC parallel circuit is substantially established in such a closed loop by the capacitor 302 and the inductor 308. The resonance frequency of the LC parallel circuit is selected to be identical to the frequency of the magnetic resonance signal. Accordingly, when the magnetic resonance signal is received, the LC parallel circuit resonates and an associated high impedance substantially brings the closed loop to the open state.

Figure 4:
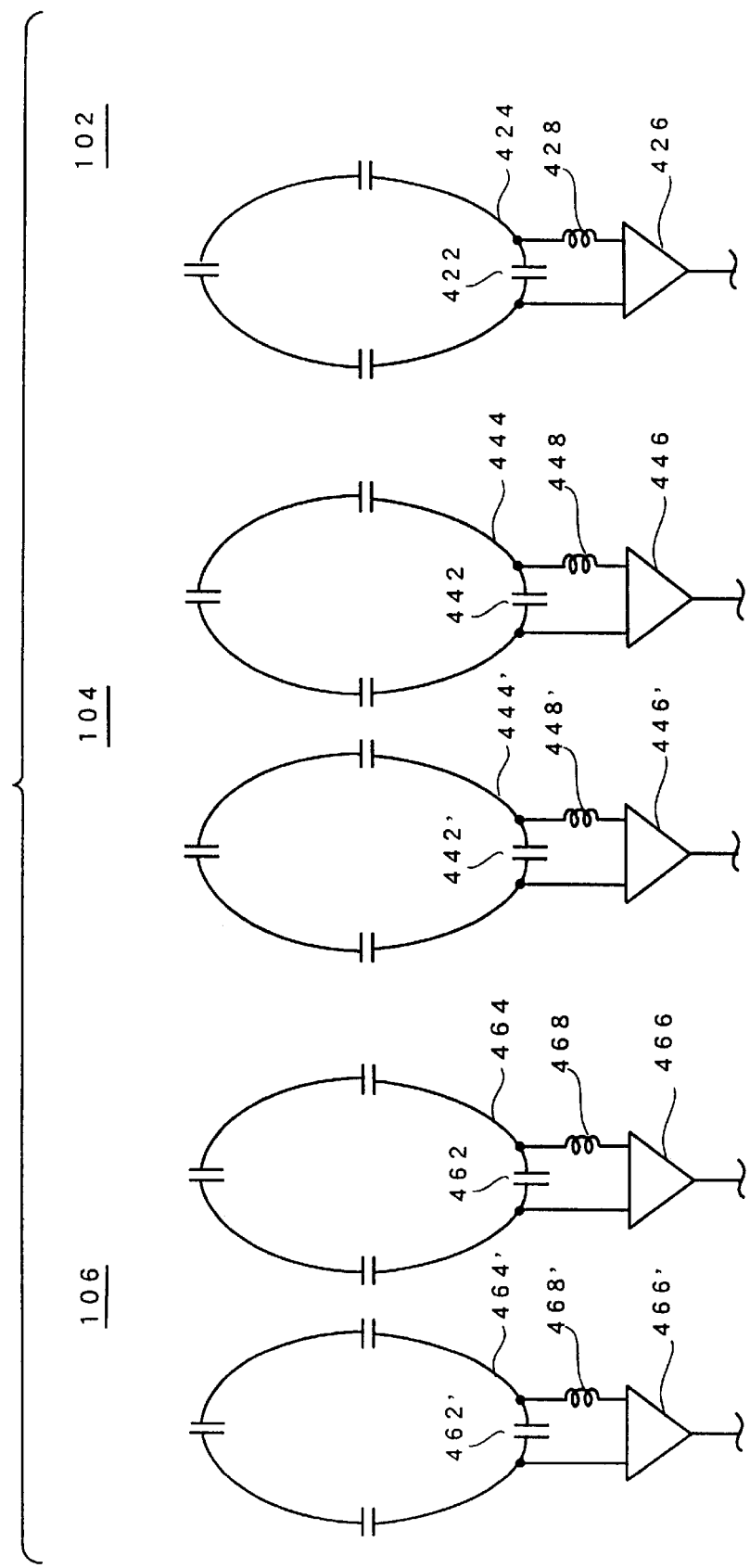
FIG. 4 is an electric circuit diagram of the receive coils in the apparatus shown in FIG. 1.

The receive coil sections 102, 104 and 106 comprising such closed loops are disposed on the imaging table 10 at certain intervals with their loop surfaces facing one another. The electric circuit of the receive coil sections 102, 104 and 106 disposed on the imaging table 10 is shown in FIG. 4. It should be noted that FIG. 4 is rendered at an angle from which the loop surfaces of the coils are viewed obliquely. As shown, the receive coil section 102 is comprised of a single closed loop, and each of the receive coil sections 104 and 106 is comprised of two closed loops. It will be easily recognized that the receive coil section 102 may also be comprised of two or more closed loops as necessary.

In the receive coil section 102, both ends of a capacitor 422 are connected with an input circuit of a preamplifier 426 via an inductor 428. The capacitor 422 and the inductor 428 establish a parallel resonance circuit that resonates with the frequency of the magnetic resonance signal.

In the receive coil section 104, both ends of a capacitor 442 are connected with an input circuit of a preamplifier 446 via an inductor 448 in one closed loop, and both ends of a capacitor 442' are connected with an input circuit of a preamplifier 446' via an inductor 448' in another closed loop. In these closed loops, the capacitor 442 and the inductor 448, and the capacitor 442' and the inductor 448' establish respective parallel resonance circuits that resonate with the frequency of the magnetic resonance signal.

In the receive coil section 106, both ends of a capacitor 462 are connected with an input circuit of a preamplifier 466 via an inductor 468 in one closed loop, and both ends of a capacitor 462' are connected with an input circuit of a preamplifier 466' via an inductor 468' in another closed loop. In these closed loops, the capacitor 462 and the inductor 468, and the capacitor 462' and the inductor 468' establish respective parallel resonance circuits that resonate with the frequency of the magnetic resonance signal.

Thus, all the closed loops substantially turn to the open state due to a high impedance caused by parallel resonance of the LC circuits in receiving the magnetic resonance signal. Since all the closed loops in the receive coil sections 102, 104 and 106 substantially turn to the open state when receiving the magnetic resonance signal, any coupling does not occur among the closed loops. Because of such decoupling, the closed loops each exist as if they exist separately, and they can individually receive the magnetic resonance signals without being affected by the neighboring closed loops. That is, the receive coil sections 102, 104 and 106 together constitute a so-called phased-array coil. It is preferred that a portion consisting of the LC circuit and the preamplifier in each receive coil section be incorporated in the electric circuit 110 under the surface of the imaging table 10, in that handling, such as mounting and wiring, of the preamplifiers is facilitated.

Figure 5:
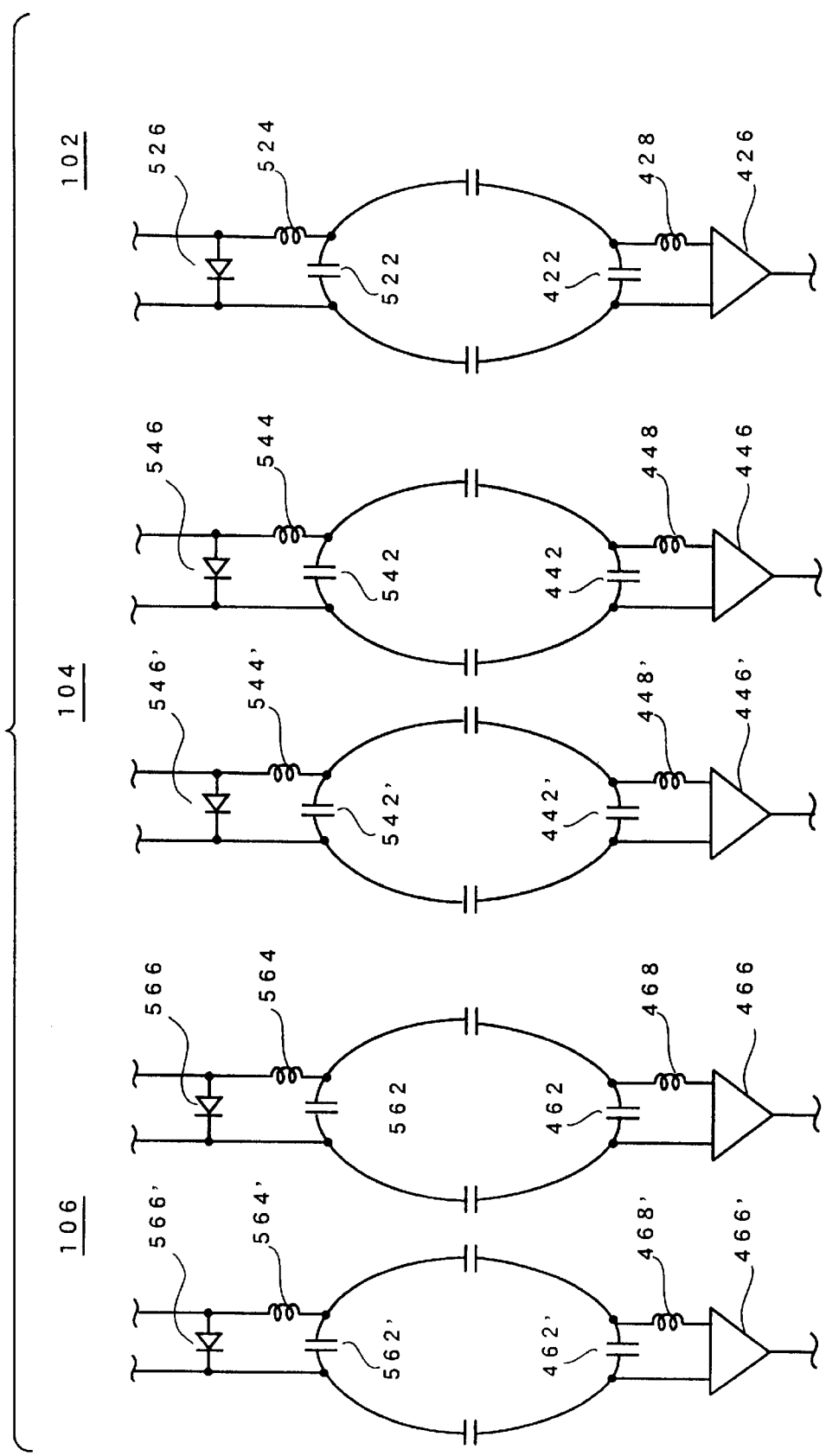
FIG. 5 is an electric circuit diagram of the receive coils in the apparatus shown in FIG. 1.
Figure 6:
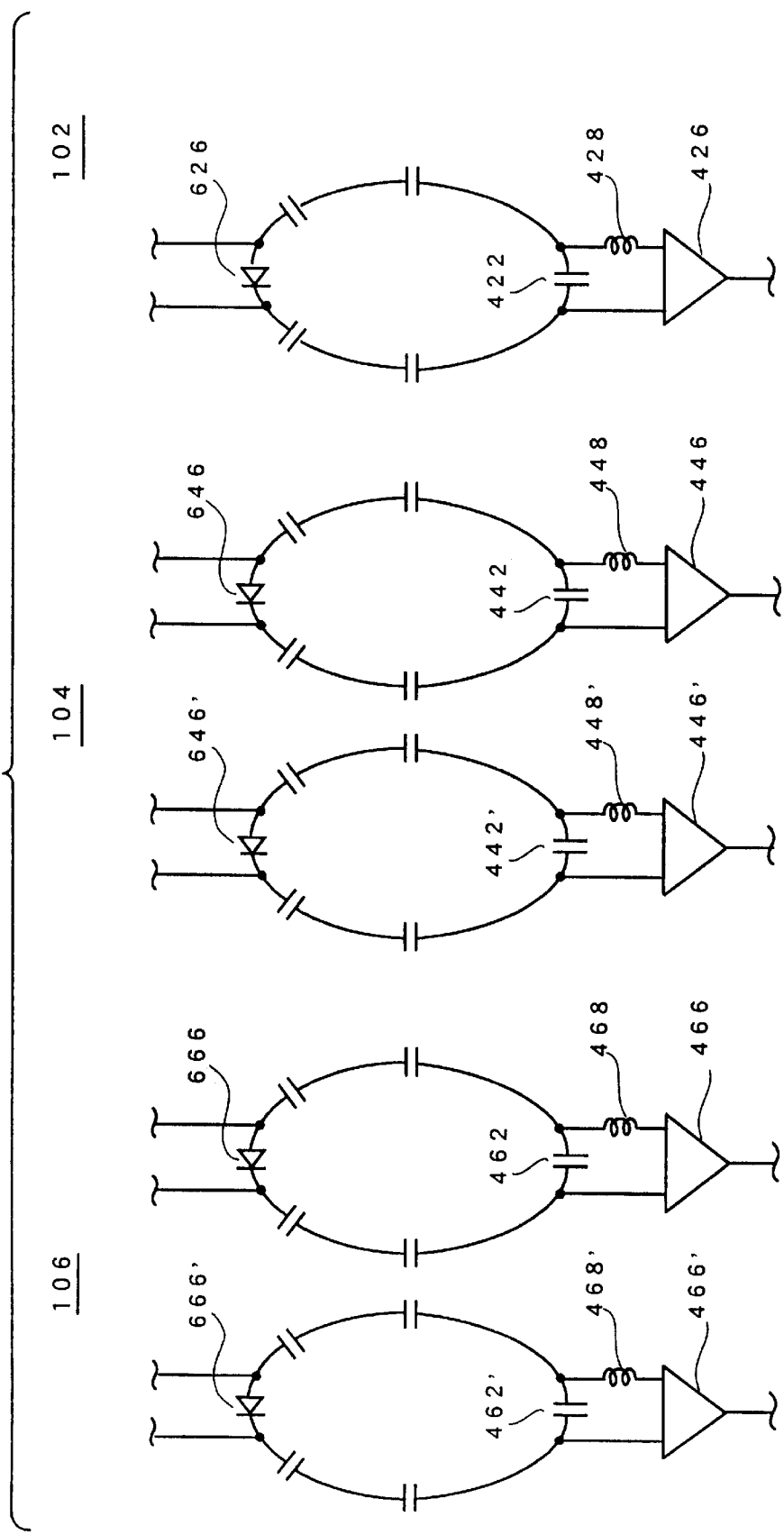
FIG. 6 is an electric circuit diagram of the receive coils in the apparatus shown in FIG. 1.

The receive coil sections 102, 104 and 106 are preferably provided with respective controllable disable circuits in order to further ensuring decoupling therebetween. FIGS. 5 and 6 show exemplary electric circuits of the receive coil sections 102, 104 and 106 having such disable circuits. In FIGS. 5 and 6, parts identical to those previously described with reference to FIG. 4 are given the same reference numerals and description will be omitted.

As shown in FIG. 5, in the receive coil section 102, a series circuit consisting of an inductor 524 and a diode 526 is connected to a capacitor 522 in the closed loop in parallel. To both ends of the diode 526 is selectively applied a forward or backward bias from a bias circuit (not shown). The application of the bias is controlled by the control section 30. The capacitor 522, the inductor 524, the diode 526 and the bias circuit constitute a disable circuit.

When the forward bias is applied, the diode 526 is turned ON and another LC parallel circuit is established in the closed loop. The resonance frequency of the LC parallel circuit is selected to be identical to the frequency of the magnetic resonance signal, and openness of the closed loop is ensured by an additional high impedance caused by the parallel resonance. When the backward bias is applied, the diode 526 is turned OFF and an LC parallel circuit will not be established.

Also in the receive coil sections 104 and 106, similar disable circuits are provided. Specifically, a capacitor 542, an inductor 544, a diode 546 and a bias circuit together constitute a disable circuit for one loop of the receive coil section 104, and a capacitor 542', an inductor 544', a diode 546' and a bias circuit together constitute a disable circuit for another loop of the receive coil section 104. Similarly, a capacitor 562, an inductor 564, a diode 566 and a bias circuit together constitute a disable circuit for one loop of the receive coil section 106, and a capacitor 562', an inductor 564', a diode 566' and a bias circuit together constitute a disable circuit for another loop of the receive coil section 106.

In FIG. 6, a diode 626 is connected in series within the closed loop of the receive coil section 102. A forward or backward bias is selectively supplied to the diode 626 from a bias circuit (not shown). The diode 626 and the bias circuit constitute a disable circuit. The bias circuit is controlled by the control section 30. By turning the diode 626 OFF by the backward bias, the conduction through the closed loop is blocked and the closed loop is brought to the disable state. By turning the diode 626 ON by the forward bias, the conduction through the closed loop is enabled and the closed loop is made to act as a receive coil.

Also in the receive coil sections 104 and 106, similar disable circuits are provided. Specifically, a diode 646 and a bias circuit constitute a disable circuit for one loop of the receive coil section 104, and a diode 646' and a bias circuit constitute a disable circuit for another loop of the receive coil section 104. Similarly, a diode 666 and a bias circuit constitute a disable circuit for one loop of the receive coil section 106, and a diode 666' and a bias circuit constitute a disable circuit for another loop of the receive coil section 106.

Figure 7:
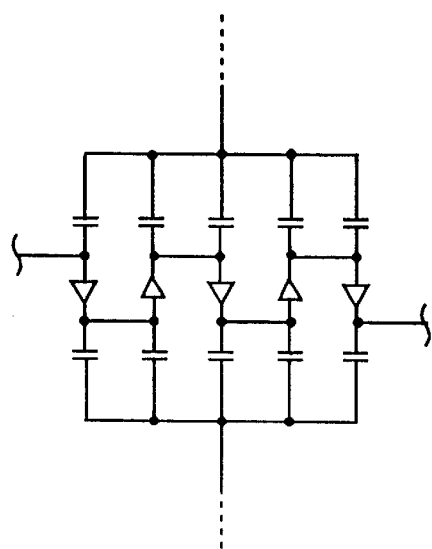
FIG. 7 is an electric circuit diagram of part of the receive coil in the apparatus shown in FIG. 1.

Additionally, in order to prevent reduction in Q of the closed loop due to the ON resistance of the diode, circuitry as exemplarily shown in FIG. 7 is employed, in which a plurality of circuits are connected to one another in parallel, each of the circuits being formed by connecting capacitors to the anode and the cathode of a diode in series, so that the polarities of the diodes are alternately inverted and all the diodes are connected to a bias circuit (not shown) in series. The ON resistance of the diodes at both ends of the parallel circuit can be thus reduced in proportion to the reciprocal of the number of the parallel lines in the circuit, thereby reducing the effect of the diode's ON resistance on the closed loop.

In such receive coil sections 102, 104 and 106, by activating the disable circuit(s) in a received coil section(s) that is not used in receiving the magnetic resonance signal, decoupling with the received coil section(s) that is used for the reception can be perfectly achieved. The disable circuits may be used for decoupling with the transmit coil sections 6, 6' in RF-excitation by the transmit coil sections 6, 6'.

Thus, the receive coil sections 102, 104 and 106 are decoupled with one another, and the effect can be obtained the same as in the case that each of the receive coil sections separately exists. Therefore, the receive coil sections 102, 104 and 106 can receive respective magnetic resonance signals from the C-, T- and L-spines without being affected by the neighboring coils and without reducing the SNR. Moreover, the simultaneous reception of the magnetic resonance signals from the spines at a plurality of positions can be achieved with a good SNR.

It is preferred that a plurality of kinds of the receive coil sections 102, 104 and 106 having different sizes be provided to allow selection according to the size of the subject, in that the measurement of the magnetic resonance signal is suitably performed. Moreover, it is preferred that the connectors on the imaging table be disposed at a plurality of positions for each connector, in order to adapt to difference in size of the subject 8.

According to the receive coil sections 102, 104 and 106, since the received signals from the closed loops are separated from one another, individual images can be reconstructed from the received signals. Specifically, images of the C-, T- and L-spines can be independently obtained. Since the received signals have a good SNR, the reconstructed images have a high quality.

In addition, the individual images can be used to obtain a combined image of the C- and T-spines, a combined image of the T- and L-spines or a combined image of all of the C-, T- and L- spines. These combined images also have a good quality.

Thus, since the spines at a plurality of positions can be imaged either separately or simultaneously, the need to exchange the receive coils each time the imaging site is changed is eliminated, unlike the conventional systems. Therefore, workability can be significantly improved and the subject need not suffer from any burden.

It should be noted that the phased-array coil may be constructed from an appropriate number of the closed loops. Thus, a receive coil having a good SNR can be provided that can image not only the spine but also the whole body of the subject 8.

Figure 9:
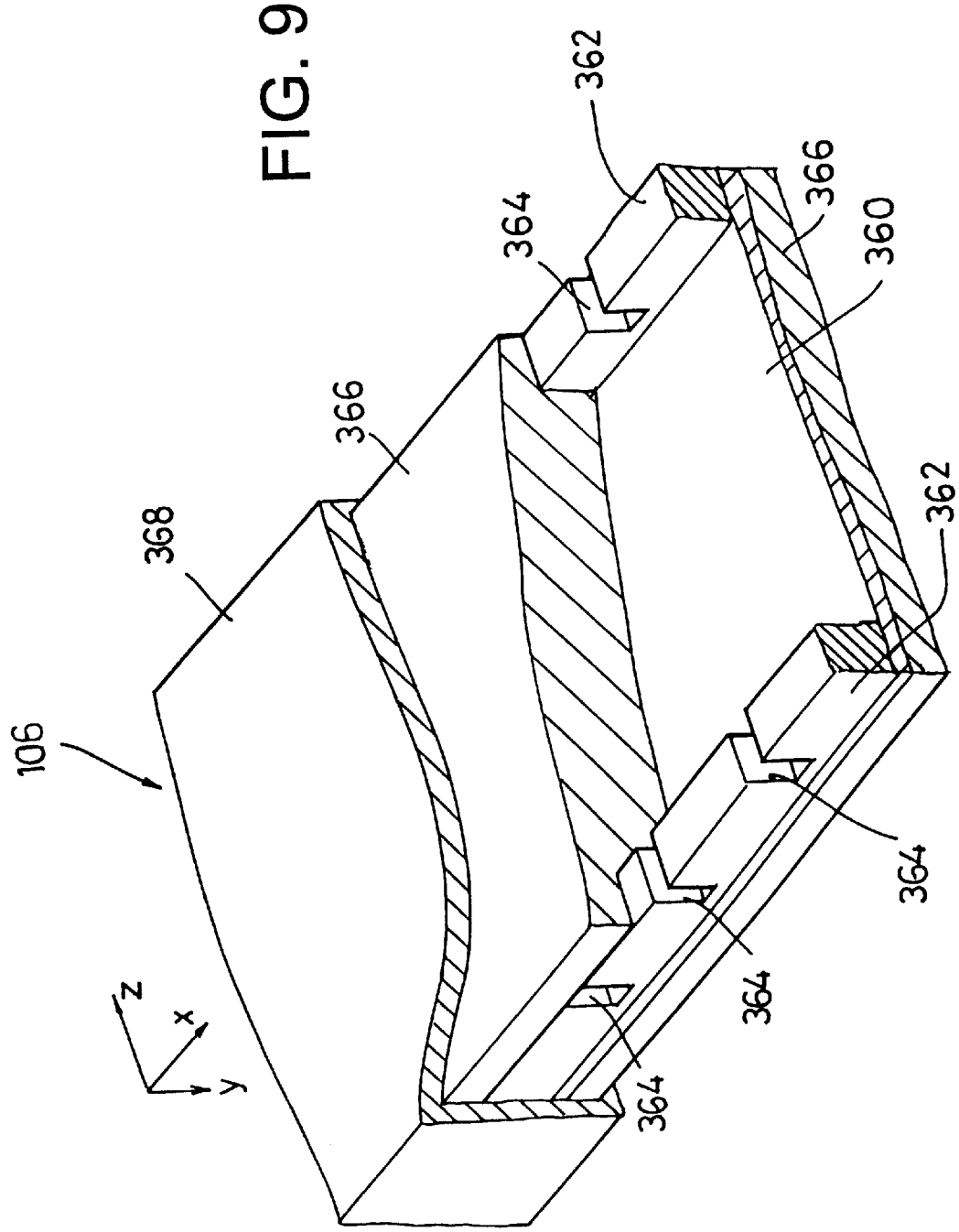
FIG. 9 is a partially broken view illustrating part of configuration of the receive coil section in the apparatus shown in FIG. 1.

FIG. 8 shows a partial coil of the receive coil section 106 exploded into a sheet-like shape. The internal structure of the receive coil section 106 in this state is shown in FIG. 9 by a partly broken view. The receive coil sections 104 and 102 have a similar structure. It should be noted that in FIG. 9 the proportion in the vertical direction is exaggerated for convenience of explanation.

As shown in FIG. 9, the receive coil section 106 comprises a flexible substrate 360. The flexible substrate 360 is provided with a pattern of electric paths by a print circuit, for example. On the longitudinal peripheries of the upper surface of the flexible substrate 360 are disposed a pair of shape defining member 362 over the length of the flexible substrate 360. The upper surface of the flexible substrate 360 corresponds to the inner side when a semi-circular cylinder is formed. The shape defining member 362 is composed of plastic, for example.

The shape defining member 362 has a certain thickness in the y-direction such that flexibility is substantially avoided. The shape defining member 362 has a plurality of U-shaped notches 364. The notch 364 is cut in the z-direction and opens upwards. The notch 364 has a depth approximately equal to the thickness of the shape defining member 362. Thus, the thickness of the bottom of the notch 364 is extremely reduced such that sufficient flexibility is obtained. Alternatively, the thickness of the bottom may be nulled.

Figure 10:
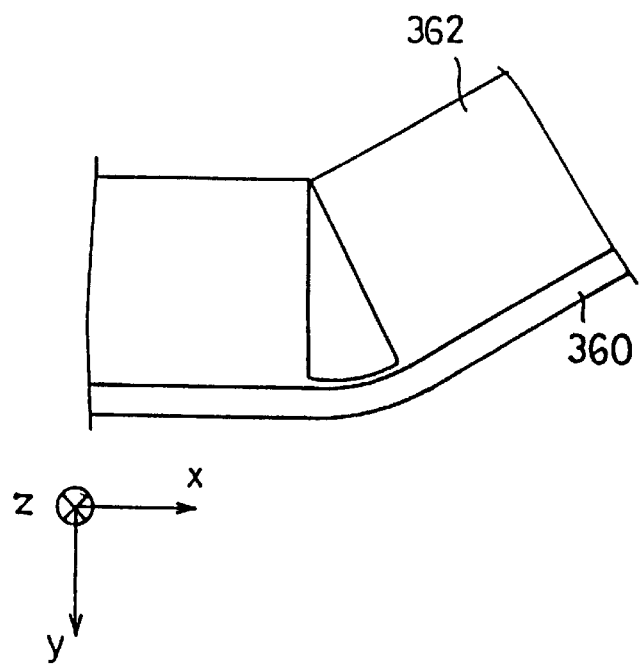
FIG. 10 illustrates function of a shape defining member of the receive coil section in the apparatus shown in FIG. 1.

Such shape defining member 362 allows only its flexible portion (i.e., the bottom of the notch) to bend when the flexible substrate 360 is curved in the direction such that a cylinder is formed, and the bending amount is limited to the extent that the opening of the notch 364 is closed, as schematically shown in FIG. 10. The allowable bending amount is determined by the width of the notch, and the wider the width of the notch is, the larger the bending allowance range is.

Figure 11:
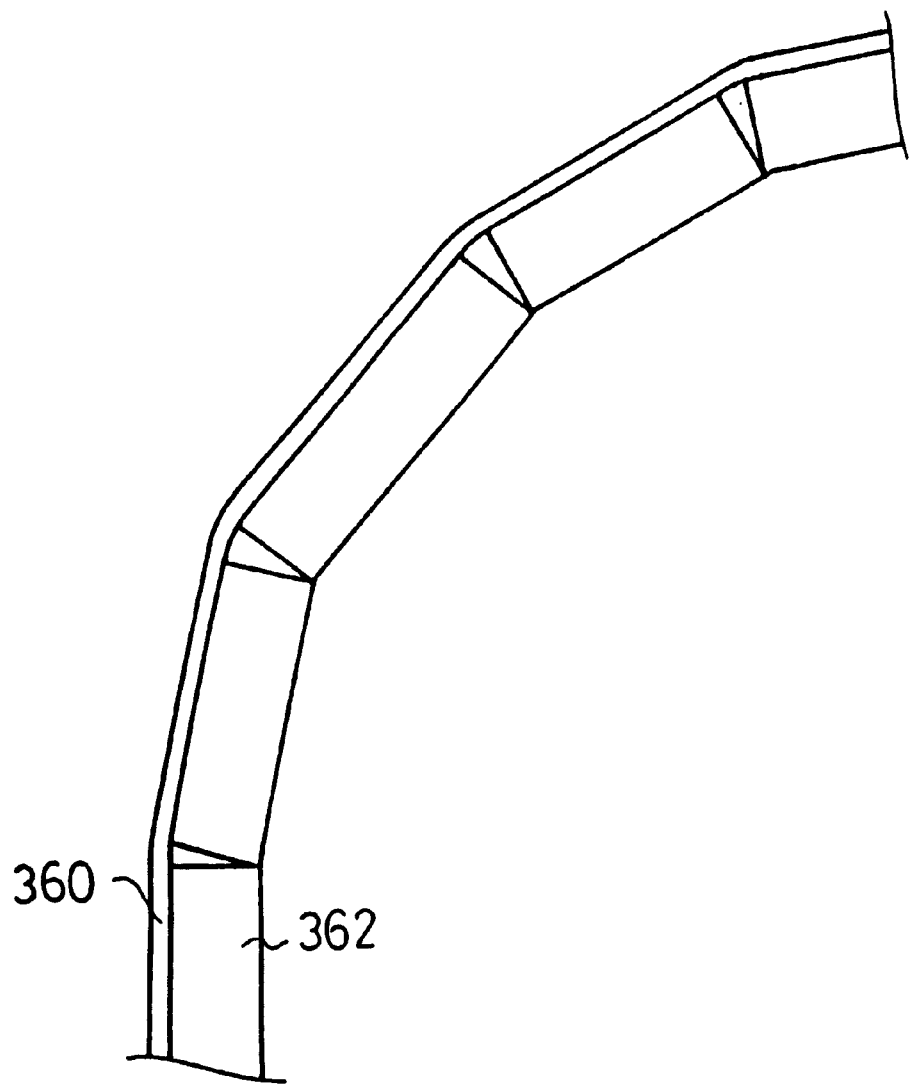
FIG. 11 illustrates function of the shape defining member of the receive coil section in the apparatus shown in FIG. 1.

The width and the intervals in the x-direction of the notch 364 are determined according to the bending amount of every portion of the flexible substrate 360 in forming the cylinder. Thus, the bending of the flexible substrate 360, as exemplarily and schematically shown in FIG. 11, is provided when the cylinder is formed. It should be noted that although only the left portion is shown in FIG. 11, the right portion is formed symmetrically. Such bending uniquely defines a curved shape of the cylinder, i.e., of the receive coil section 106. By uniquely defining the curved shape, the electromagnetic condition of the receive coil section 106 is fixed, thereby enabling stable imaging.

Over the shape defining member 362 and the flexible substrate 360 is provided a shock absorbing member 366 of sponge, for example. A similar shock absorbing member 366 is also provided on the lower surface of the flexible substrate 360. All the above structures are enclosed in an envelope 368, which is secured to the connectors 108 at both ends of the receive coil section 106.

Now the operation of the present apparatus will be described. The subject 8 is placed on the imaging table 10 in a side space (not shown) and at the same time the receive coil sections 102–106 are attached to the connectors. Three coils of the receive coil sections 102, 104 and 106 are thus formed around the neck, the breast and the hip of the subject 8. It will be easily recognized that not all of the three coils need be attached but only the appropriate coil(s) may be chosen according to the purpose of the imaging.

Next, the imaging table 10 is carried into the internal space of the static magnetic field generating section 2 and imaging is started. The imaging is carried out under the control of the control section 30. The following explanation refers to imaging by a spin-echo technique as a particular example of the magnetic resonance imaging. The spin-echo technique employs a pulse sequence as exemplarily shown in FIG. 12.

Figure 12:
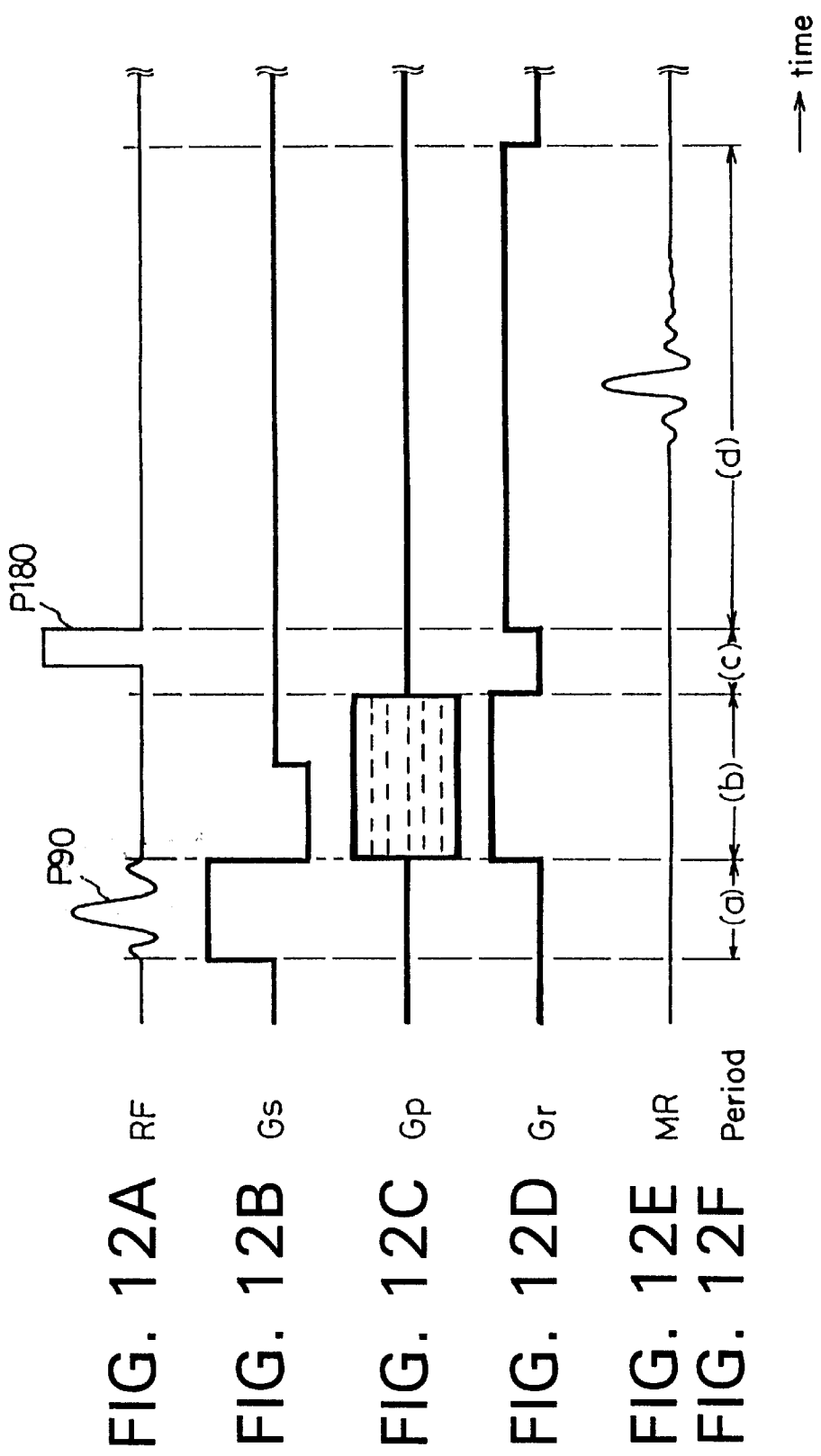
FIG. 12 is a schematic showing an exemplary pulse sequence executed by the apparatus shown in FIG. 1.

FIG. 12 is a schematic diagram of a pulse sequence for acquiring a magnetic resonance signal (spin-echo signal) for one view. Such pulse sequence is repeated 256 times, for example, to acquire spin-echo signals for 256 views.

The execution of the pulse sequence and the acquisition of the spin-echo signal are controlled by the control section 30. It will be easily recognized that the magnetic resonance imaging is not limited to being performed using the spin-echo technique but other several techniques such as a gradient-echo technique may be employed.

As shown in FIG. 12 (6), the pulse sequence is divided into four periods (a)–(d) along the time axis. First, RF excitation is achieved by a 90° pulse P90 in the period (a) as shown in (1). The RF excitation is performed by the transmit coil sections 6, 6' driven by the transmitter section 18.

Along with the RF excitation, a slice gradient magnetic field Gs is applied as shown in (2). The application of the slice gradient magnetic field Gs is performed by the gradient coil sections 4, 4' driven by the gradient driving section 16. Spins in a predefined slice within the subject 8 are thus excited (selective excitation). If the receive coil sections 102, 104 and 106 comprise disable circuits, action of the disable circuits is enabled in this period to achieve decoupling between the transmit coil sections 6, 6' and the receive coil sections 102, 104 and 106.

Next, a phase-encoding gradient magnetic field Gp is applied in a period (b) as shown in (3). The application of the phase-encoding gradient magnetic field Gp is also performed by the gradient coil sections 4, 4' driven by the gradient driving section 16. The phase encoding of the spins is thus achieved.

Also in the phase-encoding period, rephasing of the spins is achieved by the slice gradient magnetic field Gs as shown in (2). In addition, a readout gradient magnetic field Gr is applied as shown in (4) to dephase the spins. Again, the application of the readout gradient magnetic field Gr is performed by the gradient coil sections 4, 4' driven by the gradient driving section 16.

Then, a 180° pulse P180 is applied in a period (c) as shown in (1), causing the spins to be inverted. The inversion of the spins is executed by the transmit coil sections 6, 6' that are RF-driven by the transmitter section 18. If the receive coil sections 102, 104 and 106 comprise disable circuits, action of the disable circuits is enabled in this period to achieve decoupling between the transmit coil sections 6, 6' and the receive coil sections 102, 104 and 106.

Next, the readout gradient magnetic field Gr is applied in a period (d) as shown in (4). A spin-echo signal MR is thus generated from the subject 8 as shown in (5). The spin-echo signal MR is received by the receive coil sections 102, 104 and 106. Because the receive coil sections 102, 104 and 106 constitute a phased-array coil, they receive the spin-echo signals of the C-, T- and L-spines with a good SNR and without being affected by the neighboring coils. If the receive coil sections 102, 104 and 106 comprise disable circuits, a receive coil section(s) that is not used is preferably disabled then so that decoupling is perfectly achieved.

The received signal is input to the computer 24 via the receiver section 20 and the A-D converter section 22. The computer 24 stores the input signal into a memory as measured data. Thus, spin-echo data for one view is collected into the memory.

The above operation is repeated 256 times, for example, in a predetermined cycle. The phase-encoding gradient magnetic field Gp is varied for each repetition, resulting in different phase encoding each time. This is indicated by a plurality of broken lines at the waveform of FIG. 12 (3).

The computer 24 performs image reconstruction based on the spin-echo data for all views collected in the memory, and produces images of the C-, T- and L-spines.

The images of the C-, T- and L-spines thus produced are displayed on the display section 32 as a visible image. Alternatively, a composite image of the C- and T-spines, a composite image of the T- and L-spines or a composite image of all of the spines may be displayed. Because the received signal has a good SNR, these images have a good quality.

While the preceding description has been made with reference to a receive coil for spine imaging, not only the receive coil for spine imaging but also a receive coil for imaging other sites may be formed as a phased-array coil having a similar configuration to obtain the similar effect.

Figure 13:
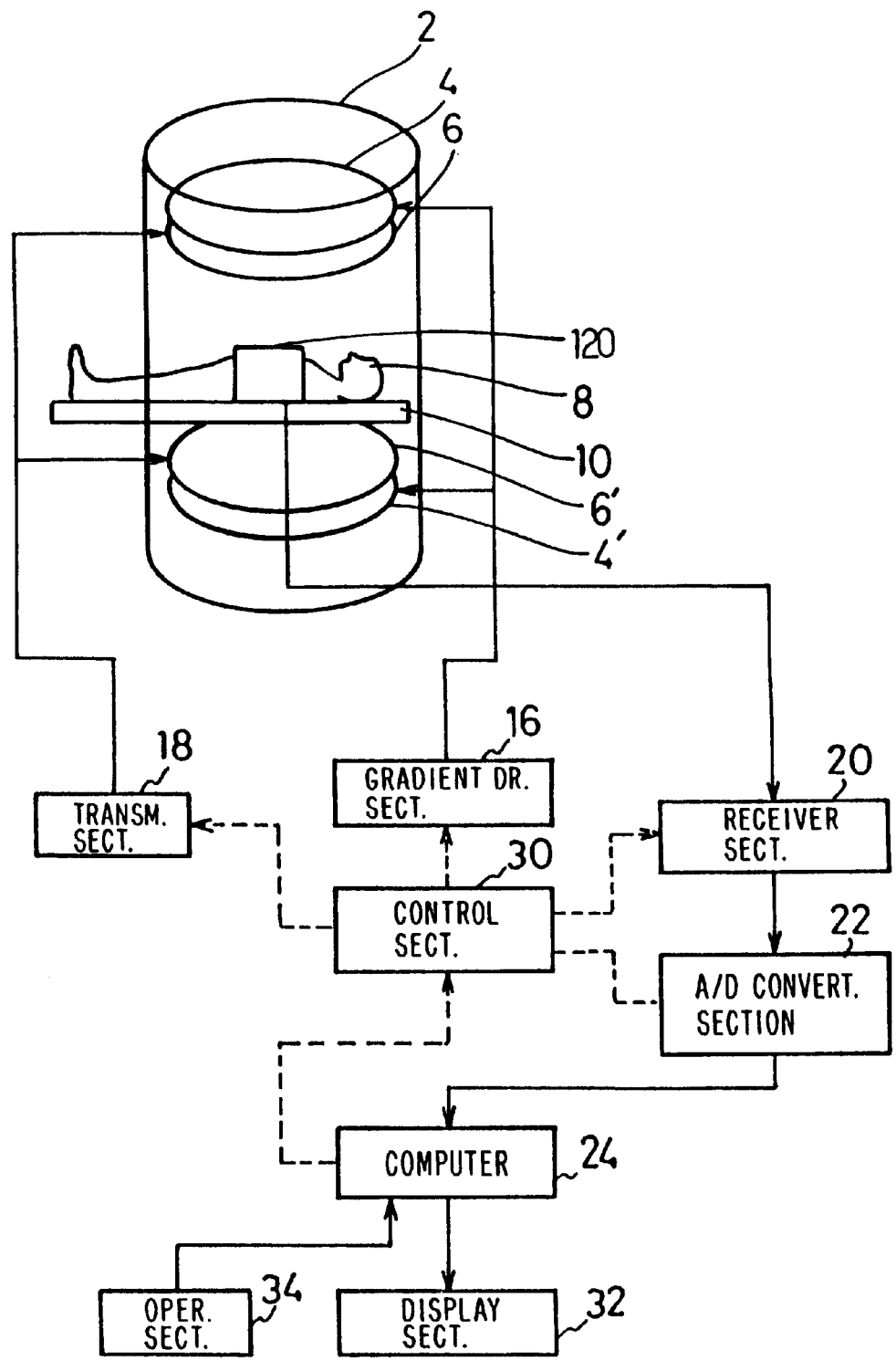
FIG. 13 is a block diagram of an apparatus in accordance with another embodiment of the present invention.

FIG. 13 shows a block diagram of a magnetic resonance imaging apparatus, which is another embodiment of the present invention. As shown, the apparatus has a receive coil section 120. Configuration excluding the receive coil section 120 is the same as that shown in FIG. 1, and therefore the same reference numerals are given to the same components and description thereof will be omitted.

Figure 14:
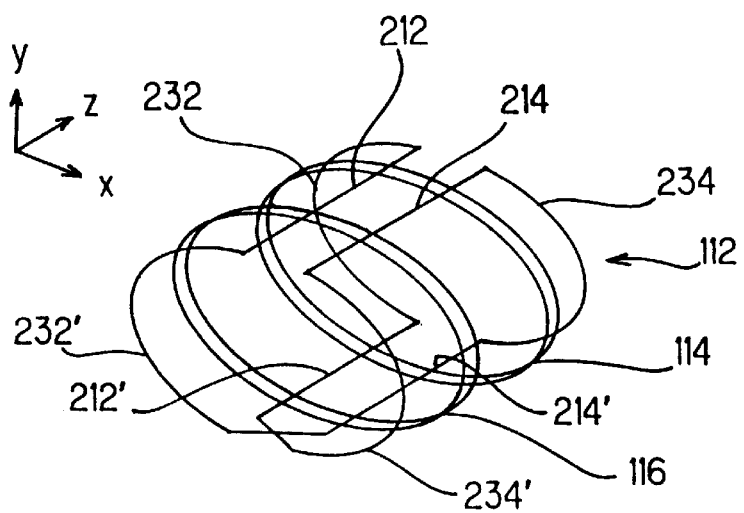
FIG. 14 schematically illustrates configuration of receive coil sections in the apparatus shown in FIG. 13.

FIG. 14 schematically shows configuration of the main portion of the receive coil section 120. As shown, the receive coil section 120 has a saddle coil 112 and solenoid coils 114 and 116 that are disposed concentrically with their axes aligned with the z-direction. The saddle coil 112 represents an embodiment of the second receive coil, and also represents an embodiment of the saddle-type coil of the present invention.

If three mutually orthogonal directions are defined as x, y and z and the direction of the static magnetic field is aligned with the y-direction, the saddle coil 112 constitutes a closed loop having linear paths 212, 214, 212' and 214' extending in the z-direction in parallel with one another, and arc-shaped paths 232, 234, 232' and 234' linking the linear paths.

The linear paths 212 and 214 lie in an x-z plane, and the linear paths 212' and 214' lie in another x-z plane spaced apart from the former one in the y-direction. The arc-shaped paths 232 and 234 lie in an x-y plane and links first ends of the linear paths 212 and 212' and links first ends of the linear paths 214 and 214', respectively. The arc-shaped paths 232' and 234' lie in another x-y plane spaced apart from the former one in the z-direction, and links second ends of the linear paths 212 and 214' and links second ends of the linear paths 214 and 212', respectively.

The saddle coil 112 forms a generally cylindrical space defined by the linear paths 212, 214, 212' and 214' and the arc-shaped paths 232, 234, 232' and 234', and holds an imaging site of the subject in the cylindrical space to receive a magnetic resonance signal generated therefrom with the sensitivity direction aligned with the x-direction. The received signal is picked up from both ends of a capacitor (not shown) disposed at an appropriate position in a loop, through a low input-impedance preamplifier connected via an inductor in a similar manner to that previously described with reference to FIG. 3.

The solenoid coil 114 and 116 are the same as the receive coil sections 104 and 106 used in the apparatus shown in FIG. 1 and either of them is comprised of two coil loops. These coil loops have a configuration so as to surround the cylindrical space holding the subject, and receive the magnetic resonance signals with the sensitivity direction aligned with the z-direction.

The received signal at each of the solenoid coils 114 and 116 is picked up through a low input-impedance preamplifier connected to both ends of a capacitor (not shown) disposed at an appropriate position in a loop via an inductor in a similar manner as in the receive coil sections 104 and 106.

Since the saddle coil 112 and the solenoid coils 114 and 116 have respective reception sensitivities in the mutually orthogonal directions, the SNR can be improved by a so-called quadrature method by adding the signals received by the saddle and solenoid coils.

Figure 15:
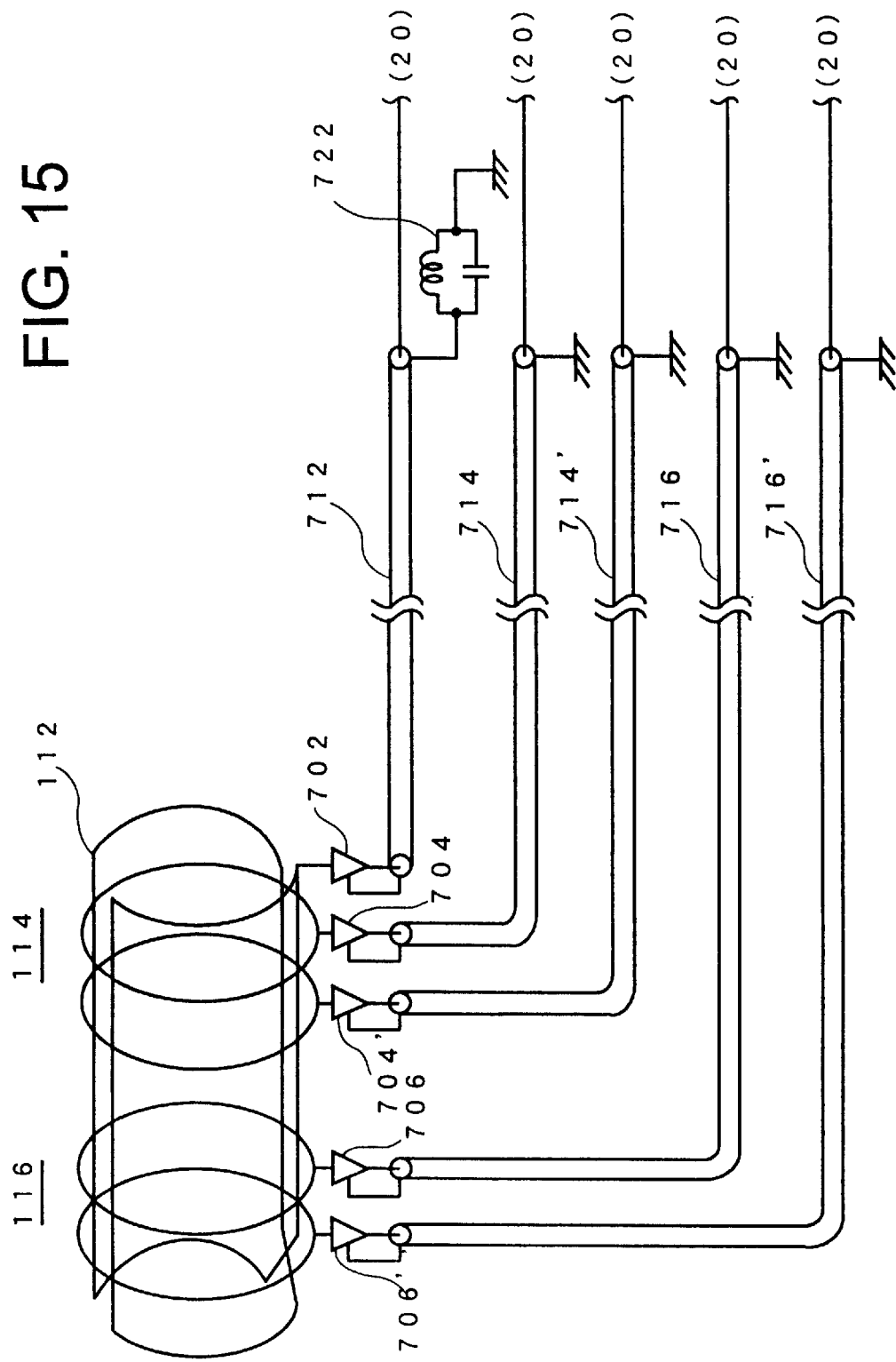
FIG. 15 illustrates electric connection of the receive coils in the apparatus shown in FIG. 13.

Such saddle coil 112 and the solenoid coils 114 and 116 are connected to the receiver section 20 via concentric cables. FIG. 15 shows a schematic illustrating an example of the connection. As shown, an output signal from a preamplifier 702 that picks up the received signal of the saddle coil 112 as described above is transmitted to the receiver section 20 through a concentric cable 712. Similarly, output signals from preamplifiers 704 and 704' that pick up the received signals of the two loops in the solenoid coil 114 as described above are transmitted to the receiver section 20 through concentric cables 714 and 714'. Output signals from preamplifiers 706 and 706' that pick up the received signals of the two loops in the solenoid coil 116 are transmitted to the receiver section 20 through concentric cables 716 and 716'.

External conductors of the concentric cables 712–716' are connected to a common ground on the side of the receiver section 20. At this time, the external conductor of the concentric cable 712 is connected to the common ground via a frequency selective signal block circuit, i.e., a trap circuit 722 constructed from, for example, a parallel circuit of an inductor and a capacitor. The external conductor of the concentric cable represents an embodiment of the ground side of the output signal line of the present invention.

Since the parallel resonance frequency of the trap circuit 722 is made identical to the frequency of the received signal, or the magnetic resonance signal, the external conductor of the concentric cable 712 is connected to the ground with a high impedance with respect to the received signal. The high impedance avoids coupling between the concentric cable 712 and the concentric cables 714–716' via the common ground. Thus, a high frequency current is blocked which otherwise circularly flows between the concentric cable 712 and the concentric cables 714–716' by the coupling through the common ground, thereby improving the SNR of the received signal.

Figure 16:
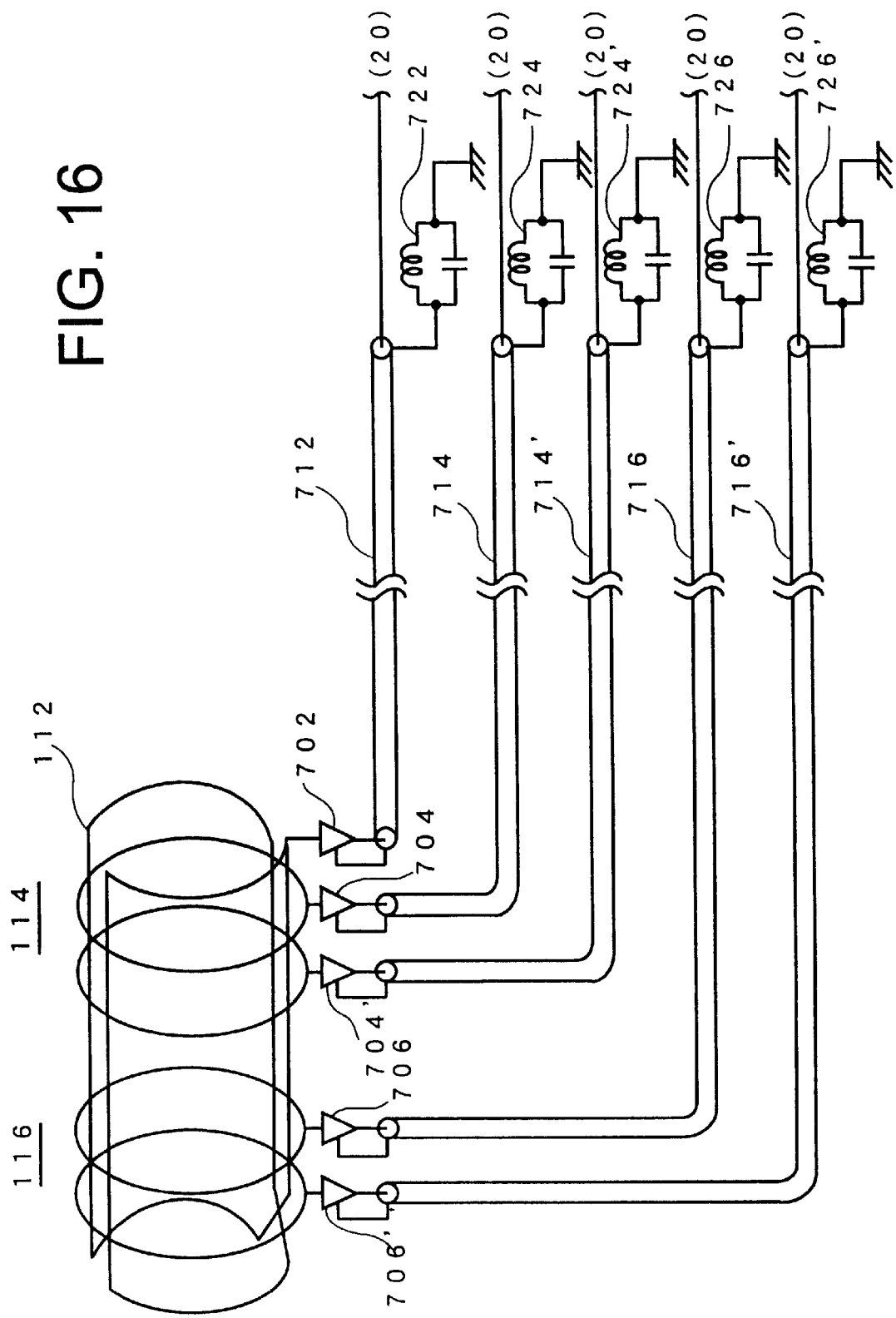
FIG. 16 illustrates electric connection of the receive coils in the apparatus shown in FIG. 13.

As exemplarily shown in FIG. 16, similar trap circuits 724–726' may be provided in the concentric cables 714–716', as well as in the concentric cable 712. Blocking of the circular current may be thus achieved more perfectly to further improve the SNR. It will be easily recognized that the similar trap circuits may be employed in the magnetic resonance imaging apparatus shown in FIG. 1.

Many widely different embodiments of the invention may be configured without departing from the spirit and the scope of the present invention. It should be understood that the present invention is not limited to the specific embodiments described in the specification, except as defined in the appended claims.

What is claimed is:

1. A receive coil comprising at least one conductive closed circular loop, said loop comprising a plurality of series connected capacitors, each capacitor having two terminals; at least one low input impedance amplifier having two terminals; and an inductor having two terminals; wherein one terminal of said amplifier is connected to one terminal of said one capacitor of said plurality of series connected capacitors; and another terminal of said amplifier being connected to one terminal of said inductor with another terminal of said inductor being connected to another terminal of said one capacitor, whereby coupling is blocked between said at least one conductive closed circular loop and other components.

2. The coil of claim 1, further comprising means for disabling said at least one conductive closed circular loop; and means for controlling said means for disabling using an external signal.

3. The coil of claim 1, further comprising a diode inserted between two adjacent capacitors of said plurality of series connected capacitors.

4. The coil of claim 1, wherein said at least one conductive closed circular loop has at least one shield disposed within the inner circumference of said loop.

5. The coil of claim 1, wherein a plurality of said closed conductive circular loops are provided.

6. The coil of claim 1, further comprising:

a diode; having two terminals; and a second inductor having two terminals; wherein one terminal of aid diode is connected to one terminal of another capacitor of said plurality of series connected capacitors, and another terminal of said diode is connected to one terminal of said second inductor with the other terminal of said second inductor being connected to another terminal of said other capacitor.

7. A magnetic resonance imaging method comprising the steps of:

generating a static magnetic field in a space for holding a subject;

generating a magnetic field in said space;

generating a high frequency magnetic field in said space;

measuring a magnetic resonance signal from said space; and producing an image based on measured magnetic resonance signal; wherein the step of measuring the magnetic resonance signal is performed using a receive coil comprising:

at least one conductive closed circular loop, said loop comprising a plurality of series connected capacitors, each capacitor having two terminals; at least one low input impedance amplifier having two terminals; and an inductor having two terminals; wherein one terminal of said amplifier is connected to one terminal of said one capacitor of said plurality of series connected capacitors; and another terminal of said amplifier being connected to one terminal of said inductor with another terminal of said inductor being connected to another terminal of said one capacitor, whereby coupling is blocked between said at least one conductive closed circular loop and other components.

8. A magnetic resonance imaging apparatus comprising:

means for generating a static magnetic filed in a space for holding a subject;

means for generating a gradient magnetic field in said space;

means for generating a high frequency magnetic field in said space;

means for measuring a magnetic resonance signal from said space; and means for producing an image based on said magnetic resonance signal measured by said means for measuring; wherein said means for measuring comprises a receive coil comprising:

at least one conductive closed circular loop, said loop comprising a plurality of series connected capacitors, each capacitor having two terminals; at least one low input impedance amplifier having two terminals; and an inductor having two terminals; wherein one terminal of said amplifier is connected to one terminal of said one capcitor of said plurality of series connected capacitors; and another termnal of said amplifier being connected to one terminal of said inductor with another terminal of said inductor being connected to another terminal of said one capacitor, whereby coupling is blocked between said at least one conductive closed circular loop and other components.

9. The apparatus of claim 8, wherein said means for measuring comprises: a second receive coil comprising a closed conductive loop comprising a plurality of series connected capacitors; said second receive coil having sensitivity in a direction perpendicular to sensitivity direction of said first mentioned receive coil; a second inductor having two terminals; a low input impedance amplifier having two terminals; wherein one terminal of said amplifier is connected to one end of one capacitor of said plurality of series connected capacitors; and another terminal of said amplifier is connected to one terminal of said second inductor with another terminal of said inductor being connected to another end of said one capcitor; and a frequency selective signal blocking circuit for connecting a ground side of an output signal line from at least one amplifier to ground.

10. The apparatus of claim 9, wherein said second receive coil is a saddle type coil.

11. The apparatus of claim 8, further comprising:

means for disabling said at least one conductive closed loop; and means for controlling said means for disabling by use of an external signal.

12. The apparatus of claim 9, wherein said frequency selective signal blocking circuit is a trap circuit.

* * * * *